United States Patent
Jones et al.

(10) Patent No.: US 12,120,955 B2
(45) Date of Patent: Oct. 15, 2024

(54) ENERGY RECOVERY

(71) Applicant: Kohler Mira Limited, Cheltenham (GB)

(72) Inventors: Oliver Jones, Cheltenham (GB); Charles Parker, Cheltenham (GB)

(73) Assignee: KOHLER MIRA LIMITED, Cheltenham (GB)

( * ) Notice: Subject to any disclaimer, the term of this patent is extended or adjusted under 35 U.S.C. 154(b) by 0 days.

(21) Appl. No.: 17/116,609

(22) Filed: Dec. 9, 2020

(65) Prior Publication Data

US 2021/0091292 A1    Mar. 25, 2021

Related U.S. Application Data

(63) Continuation of application No. PCT/GB2019/051415, filed on May 23, 2019.

(30) Foreign Application Priority Data

Jun. 20, 2018 (GB) .................................. 1810127

(51) Int. Cl.
| | |
|---|---|
| *H10N 10/13* | (2023.01) |
| *E03B 7/07* | (2006.01) |

(Continued)

(52) U.S. Cl.
CPC .............. *H10N 10/13* (2023.02); *E03B 7/07* (2013.01); *F24D 18/00* (2022.01); *H10N 10/17* (2023.02); *F24D 2101/60* (2022.01)

(58) Field of Classification Search
CPC ........... H01L 35/30; H01L 35/32; E03B 7/07; H10N 10/13; H10N 10/17; F24D 2101/60
See application file for complete search history.

(56) References Cited

U.S. PATENT DOCUMENTS

| | | | |
|---|---|---|---|
| 2006/0027257 A1 | 2/2006 | Yamaguchi et al. | |
| 2011/0094556 A1* | 4/2011 | Stark | H10N 10/17 |
| | | | 136/201 |

(Continued)

FOREIGN PATENT DOCUMENTS

| | | |
|---|---|---|
| CN | 103904939 | 7/2014 |
| CN | 105605790 | 5/2016 |

(Continued)

OTHER PUBLICATIONS

Beisteiner, C., and B. G. Zagar. "C8. 1-Thermo-Electric Energy Harvester for Low-Power Sanitary Applications." Proceedings Sensor 2013: 471-476. (Year: 2013).*

(Continued)

*Primary Examiner* — Tamir Ayad
(74) *Attorney, Agent, or Firm* — Husch Blackwell LLP

(57) ABSTRACT

An apparatus for recovering heat in an ablutionary or plumbing system includes first and second pipes for carrying fluids at different temperatures. A first heat transfer element is configured to be thermally coupled to the first pipe and a second heat transfer element configured to be thermally coupled to the second pipe, with each having an elongate portion extending in a direction away from the associated pipe. The elongate portions of the first and second heat transfer elements at least partially overlap. A thermoelectric device is provided that includes one or more thermoelectric elements located between the elongate portions, the thermoelectric element(s) being in thermal communication with the elongate portion of the first heat transfer element and the elongate portion of the second heat transfer element and being arranged to generate electricity from a temperature differential between the elongate portions of the first and second heat transfer elements.

20 Claims, 2 Drawing Sheets

(51) Int. Cl.
  *F24D 18/00*   (2022.01)
  *F24D 101/60*  (2022.01)
  *H10N 10/17*   (2023.01)

(56) References Cited

U.S. PATENT DOCUMENTS

2015/0349233 A1    12/2015  Span et al.
2021/0156126 A1*    5/2021  Gupta ................. E03C 1/057

FOREIGN PATENT DOCUMENTS

| CN | 107606245 | 1/2018 | |
| CN | 207333808 | 5/2018 | |
| DE | 10 2013 017 176 | 4/2015 | |
| EP | 2 397 790 | 12/2011 | |
| EP | 2 605 261 | 6/2013 | |
| EP | 2 673 814 | 12/2013 | |
| EP | 2 959 237 | 12/2015 | |
| EP | 2960953 A1 * | 12/2015 | ............. F28F 3/083 |
| FR | 3048554 | 3/2016 | |
| GB | 2 341 792 | 3/2000 | |
| GB | 2 386 573 | 9/2003 | |
| GB | 2 493 092 | 1/2013 | |
| JP | H05-167104 | 7/1993 | |
| JP | H05-172425 | 7/1993 | |
| NL | 1035475 | 11/2009 | |
| SE | 1050561 | 6/2010 | |
| WO | WO-2011/152784 | 12/2011 | |
| WO | WO-2016/164695 | 10/2016 | |
| WO | WO-2017/060872 | 4/2017 | |
| WO | WO-2019/243770 | 12/2019 | |

OTHER PUBLICATIONS

Combined Search and Examination Report GB 1907262.8 dtd Jun. 19, 2019 10 pgs.
Combined Search and Examination Report GB1810127.9 dtd Oct. 18, 2018; 8 pgs.
International Search Report PCT/GB2019/051415 dtd Aug. 20, 2019 3 pages.

* cited by examiner

ENERGY RECOVERY

CROSS-REFERENCE TO RELATED PATENT APPLICATIONS

The present application is a Continuation of International Application No. PCT/GB2019/051415, filed May 23, 2019, which claims the benefit of and priority to United Kingdom Priority Application GB 1810127.9, filed Jun. 20, 2018. The entire disclosures of International Application No. PCT/GB2019/051415 and United Kingdom Priority Application GB 1810127.9, including their specifications, drawings, claims, and abstracts, are incorporated herein by reference.

BACKGROUND

The present disclosure relates to energy recovery, in particular in the context of ablutionary or plumbing systems. The disclosure also relates to a device operable to recover energy, e.g. heat, in an ablutionary or plumbing system and an ablutionary or plumbing system comprising such a device.

Typically, an ablutionary system comprises a pipe for conveying hot water and a pipe for conveying cold water. The hot water and/or the cold water are supplied according to user demand, e.g. via a mixer valve, to one or more ablutionary fittings such as a tap, faucet, sprayer or showerhead, where the user makes use of water of a desired flow rate and temperature dispensed from the ablutionary fitting(s) to perform a task, e.g. to wash themselves. There is a temperature difference between the hot water and the cold water.

CN201710170162.3 discloses a sealed mixer unit for a shower, in which hot water from a hot water supply and cold water from a cold water supply come into direct contact with a hot surface and a cold surface of a thermoelectric device respectively.

It would be advantageous to provide an improved ablutionary or plumbing system as discussed herein.

SUMMARY

An exemplary embodiment relates to an apparatus operable to recover heat in an ablutionary or plumbing system comprising a first pipe for carrying fluid having a first temperature and a second pipe for carrying fluid having a second temperature, the second temperature being different from the first temperature such that there exists, in use, a temperature differential between the fluid in the first pipe and the fluid in the second pipe. The apparatus includes a first heat transfer element configured to be thermally coupled to the first pipe and comprising an elongate portion extending in a direction away from the first pipe. The apparatus also includes a second heat transfer element configured to be thermally coupled to the second pipe and comprising an elongate portion extending in a direction away from the second pipe, wherein the elongate portions of the first and second heat transfer elements at least partially overlap. The apparatus further includes a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements.

Another exemplary embodiment relates to an ablutionary or plumbing system comprising a first pipe for carrying fluid having a first temperature, a second pipe for carrying fluid having a second temperature, the second temperature being different from the first temperature, and an apparatus operable to recover heat. The apparatus includes a first heat transfer element configured to be thermally coupled to the first pipe and comprising an elongate portion extending in a direction away from the first pipe. The apparatus also includes a second heat transfer element configured to be thermally coupled to the second pipe and comprising an elongate portion extending in a direction away from the second pipe, wherein the elongate portions of the first and second heat transfer elements at least partially overlap. The apparatus further includes a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements.

Another exemplary embodiment relates to a method of converting waste heat in an ablutionary or plumbing system into electricity. The method includes providing an apparatus operable to recover heat, the apparatus including a first heat transfer element configured to be thermally coupled to the first pipe and comprising an elongate portion extending in a direction away from the first pipe; a second heat transfer element configured to be thermally coupled to the second pipe and comprising an elongate portion extending in a direction away from the second pipe, wherein the elongate portions of the first and second heat transfer elements at least partially overlap; and a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements. The method also includes thermally coupling the first heat transfer element to a first pipe and thermally coupling the second heat transfer element to a second pipe. The method also includes, when a temperature difference exists between the elongate portion of the first heat transfer element and the elongate portion of the second heat transfer element, generating electricity using the thermoelectric device.

DETAILED DESCRIPTION

Figure 1:
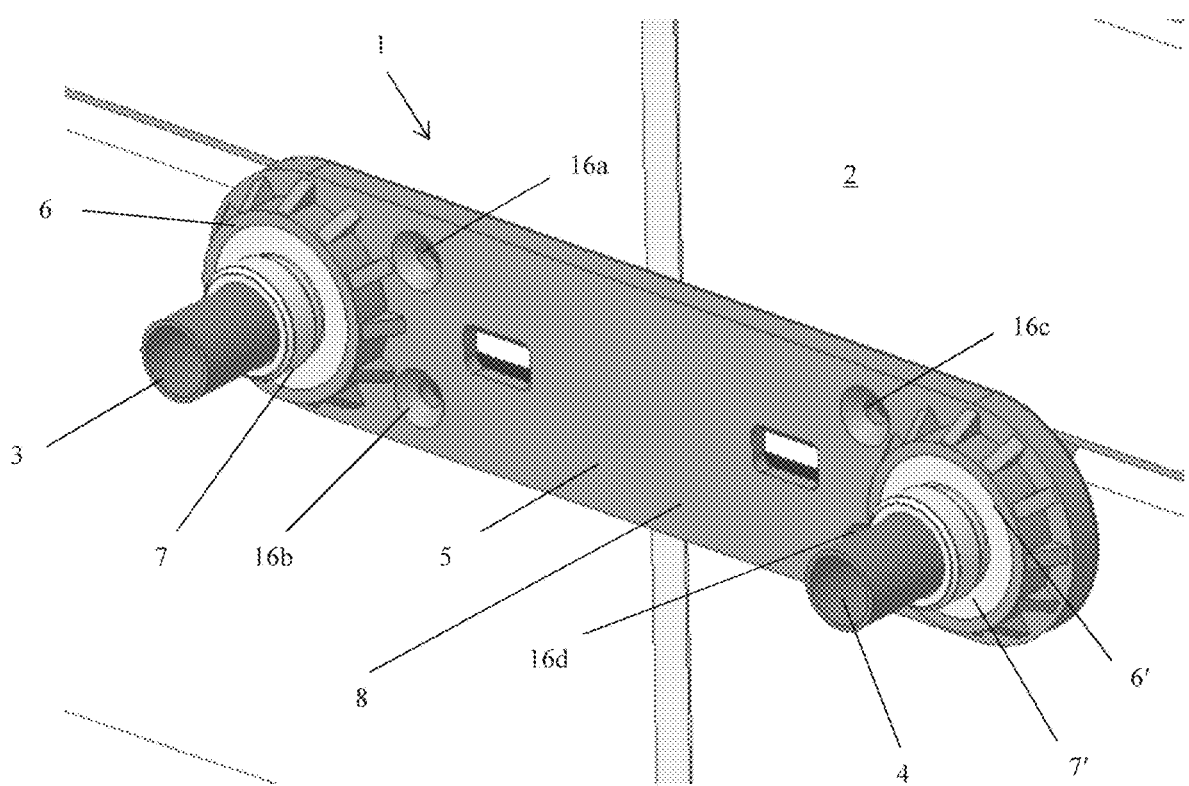
FIG. 1 shows an example of an apparatus operable to recover heat fitted in an ablutionary system.

A first aspect provides an apparatus operable to recover heat in an ablutionary or plumbing system comprising a first pipe for carrying fluid having a first temperature and a second pipe for carrying fluid having a second temperature, the second temperature being different from the first temperature such that there exists, in use, a temperature differential between the fluid in the first pipe and the fluid in the second pipe, the apparatus comprising: a first heat transfer element configured to be thermally coupled to the first pipe and comprising an elongate portion extending in a direction away from the first pipe; a second heat transfer element configured to be thermally coupled to the second pipe and comprising an elongate portion extending in a direction away from the second pipe, wherein the elongate portions of the first and second heat transfer elements at least partially overlap; and a thermoelectric device, the thermoelectric device comprising one or more thermoelectric elements located between the elongate portions, the thermoelectric element(s) being in thermal communication with the elongate portion of the first heat transfer element and the elongate portion of the second heat transfer element and being arranged to generate electricity from a temperature differential between the elongate portions of the first and second heat transfer elements.

The first and second heat transfer elements may be configured such that the temperature differential between the elongate portions of the first and second heat transfer elements is in a different plane from the temperature differential between the fluid in the first pipe and the fluid in the second pipe at the location of the apparatus. The temperature differential between the elongate portions of the first and second heat transfer elements may lie in a first plane and the temperature differential between the fluid in the first pipe and the fluid in the second pipe at the location of the apparatus may lie in a second plane, wherein the first plane and the second plane are not parallel or coplanar with each other. There may be an angle of at least 10° between the first plane and the second plane. The angle between the first plane and the second plane may be at least 30°, at least 45°, at least 60° and/or up to 90°. The first plane may be perpendicular or substantially perpendicular to the second plane. The temperature differential between the elongate portions of the first and second heat transfer elements may be perpendicular or substantially perpendicular to the temperature differential between the fluid in the first pipe and the fluid in the second pipe at the location of the apparatus.

Configuring the first and second heat transfer elements such that the temperature differential between the elongate portions of the first and second heat transfer elements is in a different plane from the temperature differential between the fluid in the first pipe and the fluid in the second pipe at the location of the apparatus may allow for more efficient use to be made of any space between the first pipe and the second pipe.

For example, thermoelectric element(s) comprising a thin layer of thermoelectric material with a large surface area may be desirable, since a thin layer leads to a steeper temperature gradient and a large surface area provides for increased heat transfer. Heat transfer elements configured as described herein may make good use of the space between the pipes, since lead the elongate portions of the heat transfer elements may be relatively close together, enabling use of a thin thermoelectric layer, and/or the elongate portions may have a relatively large surface area in thermal contact with their respective sides of the thermoelectric element(s).

In addition, making efficient use of the space between the pipes has the advantage that the apparatus can be fitted at least partially behind a wall or other surface in the space between the pipes with minimal disruption, e.g. to pre-existing wall or surface coverings such as tiles. Installing the apparatus at least partially behind a wall or other surface may be desirable for aesthetic reasons.

The elongate portions of the first and second heat transfer elements may not be in direct contact with the fluid being carried by the first and second pipes respectively.

The apparatus may be employed without diverting or otherwise disrupting the flow of fluid from its normal path along the first pipe or the second pipe. Accordingly, the apparatus may be utilized in an ablutionary or plumbing system without risking the introduction of any undesirable pressure drops, which might adversely affect user experience.

Conveniently, the apparatus may be fitted without the modification of pre-existing pipes, either during the initial installation of a new ablutionary or plumbing system or during an upgrade or refurbishment of an existing ablutionary or plumbing system. The apparatus may thus be relatively easy to install and/or retrofit.

The elongate portions of the first and/or second heat transfer elements may be solid. Solid elongate portions of the first and/or second heat transfer elements may facilitate more efficient heat transfer by conduction away from the first and/or second pipes.

The thermoelectric elements may each comprise, or consist essentially of, one or more thermoelectric materials. Any suitable thermoelectric material(s) may be used. Suitable thermoelectric materials may include, but are not limited to: bismuth telluride; bismuth selenide; antimony telluride; lead telluride; lead selenide; magnesium silicide; magnesium stannide; higher manganese silicide; skutterudite materials; Half Heusler alloys; silicon-germanium, and combinations of the above. Suitable thermoelectric materials may also include any binary, tertiary or quaternary compound, or any chemical composition, of the above listed elements (or any other elements), that exhibits favorable thermoelectric properties. The thermoelectric material may be crystalline or amorphous. The thermoelectric materials may also include any suitable combination of dopants and/or other additives that may alter the chemical composition and/or thermoelectric properties.

The thermoelectric device may comprise a plurality of thermoelectric elements. The thermoelectric elements may be connected electrically in series, e.g. via metallic interconnects, and may be arranged thermally in parallel between the elongate portion of the first heat transfer element and the elongate portion of the second heat transfer element.

The thermoelectric device may comprise one or more thermoelectric modules. Each thermoelectric module may comprise one or more, e.g. a plurality of, thermoelectric elements. The plurality of thermoelectric elements may be connected electrically in series, e.g. via metallic interconnects, and may be arranged thermally in parallel between the elongate portion of the first heat transfer element and the elongate portion of the second heat transfer element.

The first heat transfer element may comprise, or consist essentially of, a thermally conductive material, which may be a metal or an alloy. The first heat transfer element may comprise, or consist essentially of, brass, copper, aluminum or an aluminum alloy. The first heat transfer element may comprise, or consist essentially of, a thermally conductive plastic. The first heat transfer element may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The second heat transfer element may comprise, or consist essentially of, a thermally conductive material, which may be a metal or an alloy. The second heat transfer element may comprise, or consist essentially of, brass, copper, aluminum or an aluminum alloy. The second heat transfer element may comprise, or consist essentially of, a thermally conductive plastic. The second heat transfer element may comprise, or consist essentially of, a plastic such as an engineering plastic with a thermally conductive material therein and/or thereon. For instance, the thermally conductive material may coat at least partially the plastic, e.g. engineering plastic. The thermally conductive material may extend through the plastic, e.g. engineering plastic.

The apparatus may be configured such that the elongate portions of the first and second heat transfer elements are arranged, at least where they overlap, in parallel.

The first heat transfer element may be integrally formed with the first pipe.

The first heat transfer element may be joined to the first pipe by any suitable technique, e.g. welding or brazing.

The first heat transfer element may be joined to the first pipe by overcasting.

The first heat transfer element may comprise a pipe contacting portion. The pipe contacting portion may be configured to extend at least partially around the circumference of the first pipe. The pipe contacting portion may be configured to extend around up to or at least half of the circumference of the first pipe. The pipe contacting portion may be configured to extend around more than three quarters of the circumference of the first pipe.

The pipe contacting portion may be bent around at least a portion of the circumference of the first pipe.

The second heat transfer element may be integrally formed with the first pipe.

The second heat transfer element may be joined to the second pipe by any suitable technique, e.g. welding or brazing.

The second heat transfer element may be joined to the second pipe by overcasting.

The second heat transfer element may comprise a pipe contacting portion. The pipe contacting portion may be configured to extend at least partially around the circumference of the second pipe. The pipe contacting portion may be configured to extend around up to or at least half of the circumference of the second pipe. The pipe contacting portion may be configured to extend around more than three quarters of the circumference of the second pipe.

The pipe contacting portion may be bent around at least a portion of the circumference of the second pipe.

The first pipe may comprise, or consist essentially of, a thermally conductive material, which may be a metal or an alloy. The first pipe may comprise, or consist essentially of, brass, copper, aluminum or an aluminum alloy. The first pipe may comprise, or consist essentially of, a thermally conductive plastic. The first pipe may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The second pipe may comprise, or consist essentially of, a thermally conductive material, which may be a metal or an alloy. The second pipe may comprise, or consist essentially of, brass, copper, aluminum or an aluminum alloy. The second pipe may comprise, or consist essentially of, a thermally conductive plastic. The second pipe may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The first pipe may convey hot water from a hot water supply and the second pipe may convey cold water from a cold water supply or vice versa.

The first pipe and/or the second pipe may include one or more heat transfer fins therein to facilitate heat transfer from the fluid, e.g. water, flowing in the pipe(s).

The thermoelectric device may be electrically connected or connectable to one or more electrical components or devices. The electrical component(s) or device(s) may comprise one or more lights. The electrical component(s) or device(s) may be operable to produce sound. The electrical component(s) or device(s) may comprise at least one visual display or screen, e.g. an LCD or OLED screen. The electrical component(s) or device(s) may comprise one or more valves, e.g. one or more solenoid valves.

The thermoelectric device may be electrically connected or connectable to an electricity storage device such as a battery or a capacitor.

The fluid may be a liquid, e.g. water.

A second aspect provides an ablutionary or plumbing system comprising a first pipe for carrying fluid having a first temperature; a second pipe for carrying fluid having a second temperature, the second temperature being different from the first temperature; and an apparatus according to the first aspect, wherein the first heat transfer element is thermally coupled to the first pipe and the second heat transfer element is thermally coupled to the second pipe.

The first pipe may convey hot water from a hot water supply and the second pipe may convey cold water from a cold water supply or vice versa.

The first temperature may be higher than the second temperature or vice versa.

The first pipe may comprise, or consist essentially of, a thermally conductive material, which may be a metal or an alloy. The first pipe may comprise, or consist essentially of, brass, copper, aluminum or an aluminum alloy. The first pipe may comprise, or consist essentially of, a thermally conductive plastic. The first pipe may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The second pipe may comprise, or consist essentially of, a thermally conductive material, which may be a metal or an alloy. The second pipe may comprise, or consist essentially of, brass, copper, aluminum or an aluminum alloy. The second pipe may comprise, or consist essentially of, a thermally conductive plastic. The second pipe may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The first pipe may convey hot water from a hot water supply and the second pipe may convey cold water from a cold water supply or vice versa.

The ablutionary or plumbing system may comprise a hot water supply and/or a cold water supply.

Downstream of the apparatus according to the first aspect, the ablutionary or plumbing system may comprise one or more ablutionary fittings such as taps, faucets, sprayers or showerheads. The ablutionary fitting(s) may be operable to provide a user with water at a desired temperature and/or flow rate.

Downstream of the apparatus according to the first aspect, the ablutionary or plumbing system may comprise a mixer valve, e.g. a thermostatic mixer valve. The mixer valve may communicate with one or more ablutionary fittings, the one or more ablutionary fittings being downstream of the mixer valve.

The ablutionary fitting(s) may be located for example in a bathroom, a washroom, a wetroom, a kitchen or a workshop.

The first pipe and/or the second pipe may include one or more heat transfer fins therein to facilitate heat transfer from the fluid, e.g. water, flowing in the pipe(s).

The thermoelectric device may be electrically connected or connectable to one or more electrical components or devices. The electrical component(s) or device(s) may comprise one or more lights. The electrical component(s) or device(s) may be operable to produce sound. The electrical component(s) or device(s) may comprise at least one visual display or screen, e.g. an LCD or OLED screen. The electrical component(s) or device(s) may comprise one or more valves, e.g. one or more solenoid valves.

The thermoelectric device may be electrically connected or connectable to an electricity storage device such as a battery or a capacitor.

A third aspect provides a kit of parts arranged to be assembled to form a thermoelectric device or an ablutionary or plumbing system as described herein.

A fourth aspect provides a method of converting waste heat in an ablutionary or plumbing system into electricity, the method comprising: providing an apparatus according to the first aspect; thermally coupling the first heat transfer element to a first pipe; thermally coupling the second heat transfer element to a second pipe; and when a temperature difference exists between the elongate portion of the first heat transfer element and the elongate portion of the second heat transfer element, generating electricity using the thermoelectric device.

The generated electricity may be used to provide electrical power locally and/or the generated electricity may be transmitted to a remote location.

The person skilled in the art will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Figure 2:
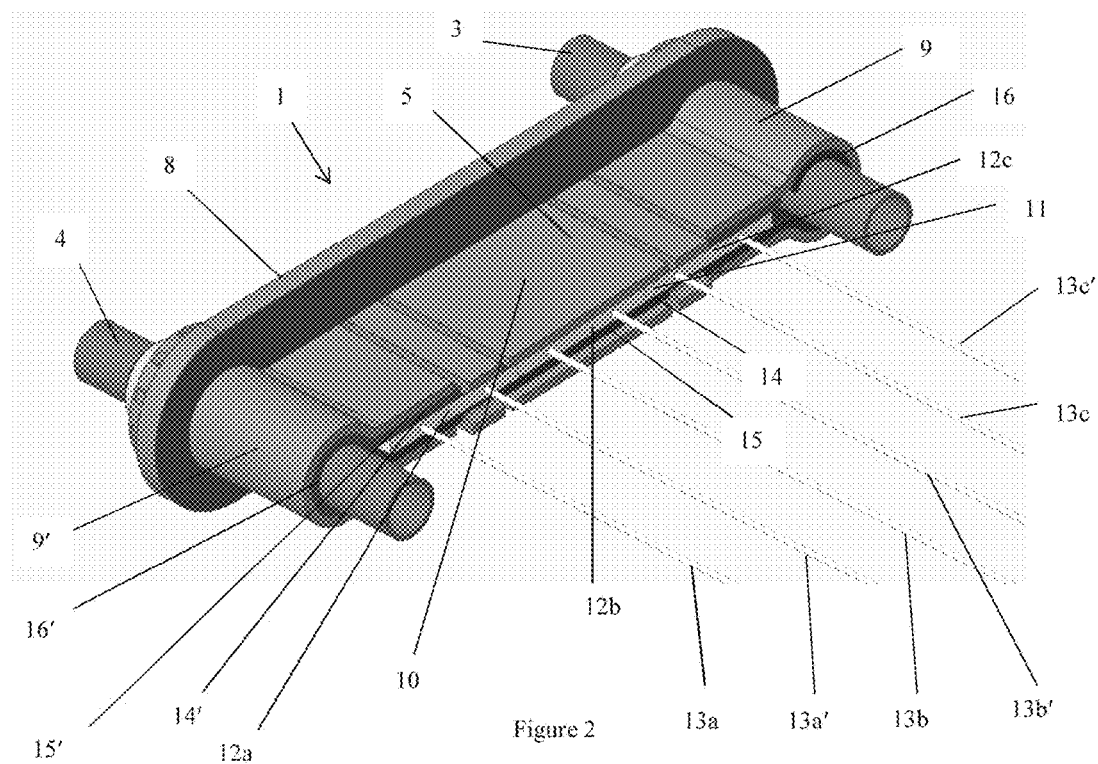
FIG. 2 is another perspective view of the apparatus shown in FIG. 1.
Figure 3:
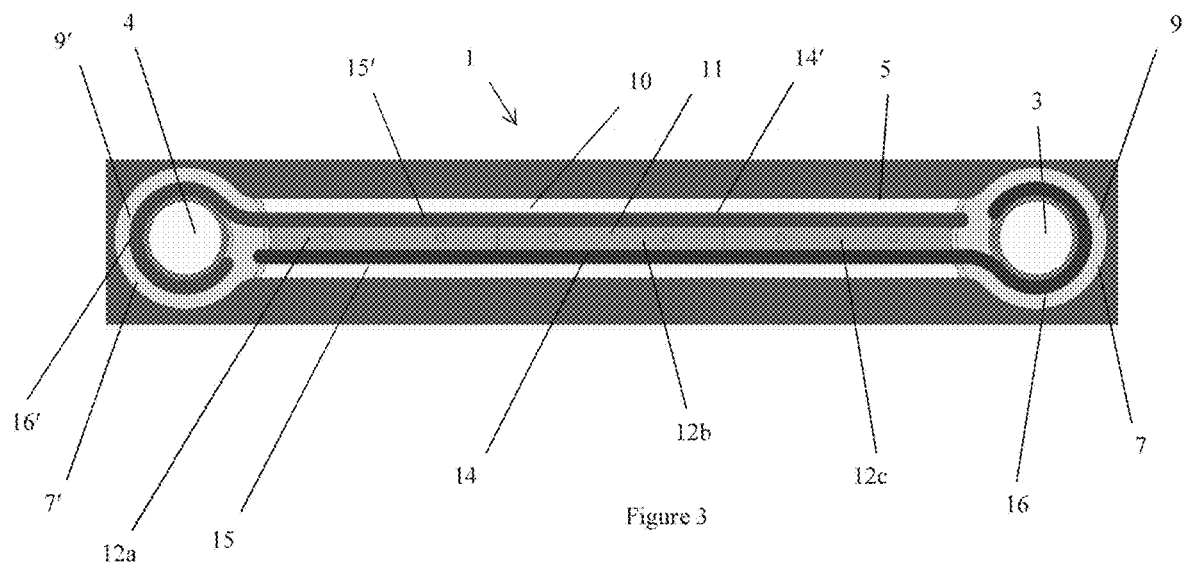
FIG. 3 is a cross-section through the apparatus shown in FIGS. 1 and 2.

Referring now to FIGS. 1, 2 and 3, there is shown an example of an apparatus 1 operable to recover heat in an ablutionary or plumbing system. The apparatus 1 may be fitted to, and/or may form part of, a wide range of ablutionary or plumbing systems. The apparatus 1 may be fitted to an existing ablutionary or plumbing system or may be fitted as part of the installation of a new ablutionary or plumbing system.

The apparatus 1 comprises a housing 5. The housing 5 comprises a front plate 8, which is adapted to be fixed to a surface such as a wall 2. The front plate 8 comprises four countersunk holes 16a, 16b, 16c, 16d for receiving fixing means (not shown) such as screws to fix the front plate 8 to the wall 2. The wall 2 may be within a bathroom or washroom. The wall 2 may be tiled at least in part.

The housing 5 further comprises a sleeve section 10 extending from a rear surface of the front plate 8. The sleeve section 10 comprises a first pipe receiving portion 9 and a second pipe receiving portion 9'. The first pipe receiving portion 9 communicates with a first aperture 6 in the front plate 8. The second pipe receiving portion 9' communicates with a second aperture 6' in the front plate 8.

The housing 5 is mounted on a first pipe 3 and a second pipe 4. The first pipe 3 and the second pipe 4 are parallel with each other. The first pipe 3 passes through the first pipe receiving portion 9 and the first aperture 6. The second pipe 4 passes through the second pipe receiving portion 9' and the second aperture 6'. A first annular sealing fitting 7 holds the first pipe 3 in the first aperture 6. A second annular sealing fitting 7' holds the second pipe 4 in the second aperture 6'.

Upstream of the apparatus 1, the first pipe 3 is connected to a cold water supply. Upstream of the apparatus 1, the second pipe 4 is connected to a hot water supply. In an example embodiment, downstream of the apparatus 1, the first pipe 3 and the second pipe 4 may communicate with a mixer valve (not shown), e.g. a thermostatic mixer valve. The mixer valve may then communicate with one or more ablutionary fittings (not shown) such as a tap, faucet, sprayer or showerhead. The ablutionary fitting(s) may be operable to provide a user with water at a desired temperature and/or flow rate.

Within the sleeve section 10 there is disposed a first heat transfer element 14. The first heat transfer element 14 comprises an elongate portion 15 and a pipe contacting portion 16. The pipe contacting portion 16 is in contact with the first pipe 3. The pipe contacting portion 16 is bent such that it extends more than three quarters of the way around the circumference of the first pipe 3. The elongate portion 15 extends away from the first pipe 3 in a lateral direction within the sleeve section 10 towards the second pipe 4. The elongate portion 15 terminates a distance away from the second pipe 4. The first heat transfer element 14 is configured to conduct heat from the first pipe 3.

Within the sleeve section 10 there is disposed a second heat transfer element 14'. The second heat transfer element 14' comprises an elongate portion 15' and a pipe contacting portion 16'. The pipe contacting portion 16' is in contact with the second pipe 4. The pipe contacting portion 16' is bent such that it extends more than three quarters of the way around the circumference of the second pipe 4. The elongate portion 15' extends away from the second pipe 4 in a lateral direction within the sleeve section 10 towards the first pipe 3. The elongate portion 15' terminates a distance away from the first pipe 3. The second heat transfer element 14' is configured to conduct heat from the second pipe 4.

The elongate portion 15 of the first heat transfer element 14 and the elongate portion 15' of the second heat transfer element 14' overlap and are disposed in parallel with each other. In the illustrated example embodiment, the elongate portion 15 of the first heat transfer element 14 and the elongate portion 15' of the second heat transfer element 14' are disposed on opposite sides of a plane containing the longitudinal axes of the first pipe 3 and the second pipe 4. Between the elongate portion 15 of the first heat transfer element 14 and the elongate portion 15' of the second heat transfer element 14', there is a thermoelectric device 11.

The thermoelectric device 11 comprises three thermoelectric modules 12a, 12b, 12c. Each thermoelectric module 12a, 12b, 12c comprises a plurality of thermoelectric elements (not shown). The thermoelectric elements extend between, and are in thermal communication with, the elongate portion 15 of the first heat transfer element 14 and the elongate portion 15' of the second heat transfer element 14'. Within each thermoelectric module 12a, 12b, 12c the thermoelectric elements are arranged thermally in parallel between the elongate portion 15 of the first heat transfer element 14 and the elongate portion 15' of the second heat transfer element 14'. The thermoelectric elements within each thermoelectric module 12a, 12b, 12c are connected electrically in series. The thermoelectric elements may comprise, or consist essentially of, any suitable thermoelectric material(s) such as bismuth telluride.

Each thermoelectric module 12a, 12b, 12c is connected to a pair of electrical wires 13a, 13a'; 13b, 13b'; 13c, 13c'. Each pair of electrical wires 13a, 13a'; 13b, 13b'; 13c, 13c' is arranged to carry electric current to and from one of the thermoelectric modules 12a, 12b, 12c.

The electrical wires 13a, 13a'; 13b, 13b'; 13c, 13c' may connect the thermoelectric modules 12a, 12b, 12c to any electrical component(s) or device(s). For instance, electricity generated in the thermoelectric modules 12a, 12b, 12c may be used to power one or more lights, e.g. LED lights. The light(s) may be decorative or ornamental. The light(s) may for example be operable to provide supplemental and/or entertaining illumination in a room such as a bathroom, wetroom or washroom, e.g. within a shower enclosure or shower cubicle. The light(s) may be indicative of the operating state of an ablutionary fitting or plumbing fixture such as a shower unit, a showerhead, a sprayer, a mixer valve, (e.g. a thermostatic mixer valve), a tap, a faucet, a toilet, a flush for a toilet or a bidet.

The thermoelectric device 11 may be electrically connected to an electricity storage device (not shown) such as a battery or a capacitor for later use according to user demand.

By powering the electrical component(s) or device(s) using electricity generated by the thermoelectric device, there may be no need to connect the electrical component(s) or device(s) to the mains or another electricity supply. For example, this may alleviate to some extent potential problems in connecting the electrical component(s) or device(s) to the mains or another electricity supply when the electrical component(s) or device(s) is/are located in a wet environment such as a shower enclosure, a shower cubicle, a bathroom, a washroom or a wetroom.

Operation of the apparatus 1 will now be described. There is a temperature difference between the cold water flowing in the first pipe 3 and the hot water flowing in the second pipe 4.

In the UK, a hot water supply may typically have a temperature of around 65° C. and a cold water supply may typically have a temperature of around 15° C. The exact temperatures of the hot water supply and/or the cold water supply may vary with location, e.g. country, season, time of day and/or weather conditions.

At the location of the apparatus 1, the temperature difference between the cold water flowing in the first pipe 3 and the hot water flowing in the second pipe 4 will depend for example on the proximity of the apparatus 1 to the hot water supply and/or the cold water supply.

The temperature difference between the cold water flowing in the first pipe 3 and the hot water flowing in the second pipe 4 may be up to or at least 10° C., up to or at least 20° C., up to or at least 30° C., up to or at least 40° C. or up to or at least 50° C.

The first heat transfer element 14 conducts heat away from the first pipe 3. The second heat transfer element 14' conducts heat away from the second pipe 4. As a consequence of the temperature difference between the water flowing in the first pipe 3 and the second pipe 4, a temperature difference exists between the elongate portion 15 of the first heat transfer element 14 and the elongate portion 15' of the second heat transfer element 14'. In the illustrated example embodiment, the temperature difference between the elongate portion 15 of the first heat transfer element 14 and the elongate portion 15' of the second heat transfer element 14' is perpendicular to the temperature difference between the cold water flowing in the first pipe 3 and the hot water flowing in the second pipe 4.

The thermoelectric device 11 is disposed between the elongate portion 15 of the first heat transfer element 14 and the elongate portion 15' of the second heat transfer element 14' and is configured to generate electricity as a result of the temperature difference between the elongate portion 15 of the first heat transfer element 14 and the elongate portion 15' of the second heat transfer element 14'.

The generated electricity is transported by the electrical wires 13a, 13a'; 13b, 13b'; 13c, 13c' to any electrical component(s) or device(s).

The thermoelectric device 11 may continue to generate electricity after a user has finished using the ablutionary fitting, since there will still be water in the first pipe 3 and the second pipe 4 and there will be a temperature difference between the water in the first pipe 3 and the second pipe 4. In embodiments, the thermoelectric device may continue to generate electricity for a period of up to or at least 5 minutes, up to or at least 10 minutes or up to or at least 15 minutes after the used has finished using the ablutionary fitting.

A portion of the generated electricity may be stored, e.g. in a capacitor or battery, for subsequent use. This may permit for example one or more electrical components and/or devices to operate during start-up of the ablutionary or plumbing system when a user operates the ablutionary fitting after a period of inactivity and the water in the second pipe 4 may be relatively cool. The water in the second pipe 4 will then heat up as water from the hot water supply flows through the second pipe 4. The thermoelectric device 11 will then generate electricity from the consequent temperature difference between the elongate portion 15 of the first heat transfer element 14 and the elongate portion 15' of the second heat transfer element 14'.

While a specific embodiment has been described, various modifications will be apparent to the person skilled in the art without departing from the scope of the present disclosure.

It will be appreciated that there is no direct water contact with the elongate portions of the heat transfer elements. No water is diverted away from the pipes during operation of the apparatus. Accordingly, use of the apparatus may have minimal effect on the operation of the ablutionary or plumbing system. The apparatus recovers energy (heat) that would otherwise go to waste and generates useful electricity.

Either one of the first pipe and the second pipe may be connected to a cold water supply and the other of the first pipe and the second pipe may be connected to a hot water supply.

The first pipe and/or the second pipe may typically be made at least in part from at least one thermally conductive material such as a metal or an alloy, which may comprise, or consist essentially of, copper, aluminum or brass. The first and/or the second pipe may comprise, or consist essentially of, a thermally conductive plastic. The first and/or the second pipe may comprise, or consist essentially of, a plastic such as an engineering plastic with a thermally conductive material therein and/or thereon. For instance, the thermally conductive material may coat at least partially the plastic. The thermally conductive material may extend through the plastic, e.g. engineering plastic.

The first pipe and/or the second pipe may be of any diameter and/or thickness. For instance, the first pipe and/or the second pipe may have an outer diameter of up to or at least 10 mm, up to or at least 15 mm, up to or at least 20 mm, up to or at least 25 mm or up to or at least 30 mm.

The first pipe and/or the second pipe may comprise one or more fins therein arranged to provide additional heat transfer from the (hot or cold) water flowing therethrough.

The first and/or the second heat transfer element may typically be made at least in part from at least one thermally conductive material such as a metal or an alloy, which may comprise, or consist essentially of, copper, aluminum or brass. The first and/or the second heat transfer element may comprise, or consist essentially of, a thermally conductive plastic. The first and/or the second heat transfer element may comprise, or consist essentially of, a plastic such as an engineering plastic with a thermally conductive material therein and/or thereon. For instance, the thermally conductive material may coat at least partially the plastic, e.g. engineering plastic. The thermally conductive material may extend through the plastic, e.g. engineering plastic.

It will be appreciated that in general, it may be desirable for the heat transfer from each of the pipes to the heat transfer element thermally coupled thereto to be as efficient and/or large as possible, in order to provide a suitable temperature difference for the thermoelectric device to generate electricity.

Accordingly, each pipe contacting portion may be configured to maximize contact with the pipe to which it is to be coupled. The or each pipe contacting portion may extend at least halfway around the circumference of the pipe. The or each pipe contacting portion may extend up to or at least three quarters of the way around the circumference of the pipe.

The heat transfer elements each may be joined to their respective pipes by any suitable joining means, e.g. soldering, brazing, welding or overcasting. In an embodiment, a portion of each heat transfer element may be overcast on to the pipe. For example, overcasting of aluminum on to a copper pipe may provide a good thermal interface between the heat transfer element and the pipe.

The first heat transfer element may be integrally formed with the first pipe. The second heat transfer element may be integrally formed with the second pipe. The sleeve section may be of any length. For instance, the sleeve section may have a length of up to or at least 2 cm, up to or at least 5 cm or up to or at least 10 cm.

The housing may be attached or attachable to a surface such as a wall by any suitable means.

The housing may comprise more than one part.

It will be understood that the invention is not limited to the embodiments above-described and various modifications and improvements can be made without departing from the concepts herein. Except where mutually exclusive, any of the features may be employed separately or in combination with any other features and the disclosure extends to and includes all combinations and sub-combinations of one or more features described herein.

What is claimed is:

1. An apparatus operable to recover heat in an ablutionary or plumbing system comprising a first pipe for carrying fluid having a first temperature and a second pipe for carrying fluid having a second temperature, the second temperature being different from the first temperature such that there exists, in use, a temperature differential between the fluid in the first pipe and the fluid in the second pipe, the apparatus comprising:

a first heat transfer element configured to be thermally coupled to the first pipe and comprising an elongate portion extending in a direction away from the first pipe and toward the second pipe;

a second heat transfer element configured to be thermally coupled to the second pipe and comprising an elongate portion extending in a direction away from the second pipe and toward the first pipe, wherein the elongate portions of the first and second heat transfer elements at least partially overlap in a direction substantially perpendicular to the direction that each of the elongate portions extend; and a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements;

wherein each of the first heat transfer element and the second heat transfer element comprises a pipe contacting portion, and wherein the thermoelectric device is disposed between the first pipe and the second pipe, wherein the thermoelectric device comprises a first pair of sides defining a width of the thermoelectric device and a second pair of sides defining a height of the thermoelectric device, wherein the width is greater than the height, and wherein each of the elongate portions abut one of the sides of the first pair of sides.

2. The apparatus according to claim 1, wherein the first and second heat transfer elements are configured such that the temperature differential between the elongate portions of the first and second heat transfer elements is in a different plane from the temperature differential between the fluid in the first pipe and the fluid in the second pipe at the location of the apparatus.

3. The apparatus according to claim 1, wherein the temperature differential between the elongate portions of the first and second heat transfer elements lies in a first plane and the temperature differential between the fluid in the first pipe and the fluid in the second pipe lies in a second plane, wherein there is an angle of at least 10° between the first plane and the second plane, optionally wherein the angle between the first plane and the second plane is at least 30°, at least 45°, at least 60° and/or up to 90°.

4. The apparatus according to claim 1, wherein the temperature differential between the elongate portions of the first and second heat transfer elements is perpendicular or substantially perpendicular to the temperature differential between the fluid in the first pipe and the fluid in the second pipe at the location of the apparatus.

5. The apparatus according to claim 1, wherein the elongate portions of the first and second heat transfer elements are not in direct contact with the fluid being carried by the first and second pipes, respectively.

6. The apparatus according to claim 1, wherein the elongate portions of the first and second heat transfer elements are solid.

7. The apparatus according to claim 1, wherein the one or more thermoelectric elements each comprise one or more thermoelectric materials selected from the group consisting of bismuth telluride, bismuth selenide, antimony telluride, lead telluride, lead selenide, magnesium silicide, magnesium stannide, higher manganese silicide, skutterudite materials, Half Heusler alloys, silicon-germanium, and combinations thereof.

8. The apparatus according to claim 1, wherein the thermoelectric device comprises a plurality of thermoelectric elements, wherein the thermoelectric elements are connected electrically in series and are arranged thermally in parallel between the elongate portion of the first heat transfer element and the elongate portion of the second heat transfer element.

9. The apparatus according to claim 1, wherein the apparatus is configured such that the elongate portions of the first and second heat transfer elements are arranged, at least where they overlap, in parallel.

10. The apparatus according to claim 1, wherein the first heat transfer element is integrally formed with or joined to the first pipe and/or the second heat transfer element is integrally formed with or joined to the second pipe.

11. The apparatus according to claim 1, wherein the pipe contacting portion of the first pipe is configured to extend at least partially around the circumference of the first pipe and the pipe contacting portion of the second pipe is configured to extend at least partially around the circumference of the second pipe.

12. The apparatus according to claim 1, wherein the contacting portion of the first heat transfer element is structured to wrap around the first pipe and the contacting portion of the second heat transfer element is structured to wrap around the second pipe, and wherein the thermoelectric device is arranged in parallel with the elongate portions of the first and second heat transfer elements.

13. An ablutionary or plumbing system comprising:
a first pipe for carrying fluid having a first temperature;
a second pipe for carrying fluid having a second temperature, the second temperature being different from the first temperature; and
an apparatus operable to recover heat, the apparatus comprising:
a first heat transfer element configured to be thermally coupled to the first pipe and comprising an elongate portion extending in a direction away from the first pipe and toward the second pipe;
a second heat transfer element configured to be thermally coupled to the second pipe and comprising an elongate portion extending in a direction away from the second pipe and toward the first pipe, wherein the elongate portions of the first and second heat transfer elements at least partially overlap in a direction substantially perpendicular to the direction that each of the elongate portions extend; and
a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements;
wherein each of the first heat transfer element and the second heat transfer element comprises a pipe contacting portion, and wherein the thermoelectric device is disposed between the first pipe and the second pipe,
wherein the thermoelectric device comprises a first pair of sides defining a width of the thermoelectric device and a second pair of sides defining a height of the thermoelectric device,
wherein the width is greater than the height, and
wherein each of the elongate portions abut one of the sides of the first pair of sides.

14. The system according to claim 13, wherein the first pipe is configured to convey hot water from a hot water supply and the second pipe is configured to convey cold water from a cold water supply.

15. The system according to claim 13, wherein at least one of the first pipe and the second pipe includes one or more heat transfer fins therein to facilitate heat transfer from the fluid flowing in the first pipe and/or the second pipe.

16. The system according to claim 13, wherein the thermoelectric device is configured to be electrically connected to one or more electrical components or devices selected from the group consisting of one or more lights, a device that is operable to produce sound, a visual display or screen, and a valve.

17. The system according to claim 13, wherein the thermoelectric device is configured to be electrically connected to an electricity storage device.

18. The system according to claim 13, wherein downstream of the apparatus, the ablutionary or plumbing system comprises one or more additional fittings.

19. The system according to claim 13, wherein downstream of the apparatus, the ablutionary or plumbing system comprises one or more mixer valves.

20. A method of converting waste heat in an ablutionary or plumbing system into electricity, the method comprising:
providing an apparatus operable to recover heat, the apparatus comprising:
a first heat transfer element configured to be thermally coupled to a first pipe and comprising an elongate portion extending in a direction away from the first pipe and toward a second pipe;
a second heat transfer element configured to be thermally coupled to the second pipe and comprising an elongate portion extending in a direction away from the second pipe and toward the first pipe, wherein the elongate portions of the first and second heat transfer elements at least partially overlap in a direction substantially perpendicular to the direction that each of the elongate portions extend; and
a thermoelectric device, the thermoelectric device comprising one or more thermoelectric elements located between the elongate portions, the one or more thermoelectric elements being in thermal communication with the elongate portion of the first heat transfer element and the elongate portion of the second heat transfer element and being arranged to generate electricity from a temperature differential between the elongate portions of the first and second heat transfer elements;
wherein each of the first heat transfer element and the second heat transfer element comprises a pipe contacting portion, and wherein the one or more thermoelectric elements are disposed between the first pipe and the second pipe;
thermally coupling the first heat transfer element to the first pipe;
thermally coupling the second heat transfer element to the second pipe; and
when a temperature difference exists between the elongate portion of the first heat transfer element and the elongate portion of the second heat transfer element, generating electricity using the thermoelectric device,
wherein the thermoelectric device comprises a first pair of sides defining a width of the thermoelectric device and a second pair of sides defining a height of the thermoelectric device,
wherein the width is greater than the height, and
wherein each of the elongate portions abut one of the sides of the first pair of sides.

* * * * *